(12) United States Patent
Jonishi

(10) Patent No.: US 8,791,511 B2
(45) Date of Patent: Jul. 29, 2014

(54) SEMICONDUCTOR DEVICE AND MANUFACTURING METHOD THEREOF

(71) Applicant: Fuji Electric Co., Ltd., Kawasaki (JP)

(72) Inventor: Akihiro Jonishi, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 13/894,627

(22) Filed: May 15, 2013

(65) Prior Publication Data

US 2013/0328104 A1  Dec. 12, 2013

(30) Foreign Application Priority Data

Jun. 7, 2012   (JP) .................. 2012-129794

(51) Int. Cl.
*H01L 29/76* (2006.01)

(52) U.S. Cl.
USPC ........... 257/288; 257/139; 257/141; 257/341; 257/343

(58) Field of Classification Search
USPC .......................... 257/139, 141, 288, 341, 343
See application file for complete search history.

(56) References Cited

U.S. PATENT DOCUMENTS

| | | |
|---|---|---|
| 5,347,155 A | 9/1994 | Ludikhuize |
| 6,326,831 B1 | 12/2001 | Kumagai |

FOREIGN PATENT DOCUMENTS

| | | |
|---|---|---|
| JP | 06-2044782 A | 7/1994 |
| JP | 2000-252809 A | 9/2000 |
| JP | 2005-175063 A | 6/2005 |
| JP | 2009-277776 A | 11/2009 |

OTHER PUBLICATIONS

Mohamed Imam, et al. "Design and Optimization of Double-RESURF High-Voltage Lateral Devices for a Manufacturable Process" IEEE Transactions on Electron Devices, vol. 50, No. 7, Jul. 2003.

*Primary Examiner* — Tan N Tran

(74) *Attorney, Agent, or Firm* — Rossi, Kimms & McDowell LLP

(57) ABSTRACT

A semiconductor device is disclosed which has a high voltage isolation structure that is a RESURF structure, wherein it is possible to reduce a displacement current generated by dV/dt noise, and a method of manufacturing the semiconductor device. It is possible to increase a lateral resistance without changing the total amount of electric charges in the uppermost surface p-type diffusion layer by using an uppermost surface p-type diffusion layer configuring a double-RESURF structure being formed so that high concentration regions with a deep diffusion depth and low concentration regions with a shallow diffusion depth are alternately arranged adjacent to each other. As a result, it is possible to reduce a displacement current generated by dV/dt noise.

14 Claims, 20 Drawing Sheets

SEMICONDUCTOR DEVICE AND MANUFACTURING METHOD THEREOF

BACKGROUND OF THE INVENTION

A. Field of the Invention

The present invention relates to a semiconductor device such as a high voltage integrated circuit (HVIC) having a high voltage isolation structure that is a double-RESURF structure, and to a method of manufacturing the semiconductor device.

B. Description of the Related Art

In an industrial inverter, heretofore, a transformer or a photocoupler has been used for electrical insulation in order to gate drive a semiconductor device such as an IGBT configuring a power conversion bridge circuit. In recent years, in order to reduce cost a high voltage IC with no electrical insulation has been used mainly for low-power applications.

FIG. 16 is a common gate drive circuit diagram of a high voltage IC. High voltage IC (HVIC) 806 includes high side drive circuit 803 that operates using a power source Vb with an emitter potential (Vs) at the low potential side main terminal of upper arm IGBT 801 as a reference. Also, high voltage IC 806 includes level shifters 804 that transmit a signal to high side drive circuit 803 from a control circuit (not shown). Furthermore, high voltage IC 806 includes low side drive circuit 805 that drives lower arm IGBT 802 on receiving the signal from the control circuit, and operates using a power source Vcc with an emitter potential (COM) at the low potential side main terminal of lower arm IGBT 802 as a reference. Level shift resistances 807 are connected to level shifters 804, thus creating a mechanism wherein the signal from the control circuit is transmitted to high side drive circuit 803 by a current caused to flow through the level shift resistances 807 being controlled by level shifters 804. In order to reduce a power loss in level shifters 804, it is common to include two level shifters 804 for SET (ON) and RESET (OFF).

High voltage MOSFETs are normally used as level shifters 804. As the high voltage IC has to withstand an overvoltage generated as a result of a turning on/off of IGBTs or the like, a breakdown voltage of 600V or higher is required in the case of an AC 200V inverter, and a breakdown voltage of 1200V or higher is required in the case of an AC 400V inverter. In order to realize this high breakdown voltage, a RESURF structure is widely used in high voltage MOSFETs used as level shifters 804, and a double-RESURF structure suitable for a high breakdown voltage is often used in the case of an AC 400V inverter.

FIG. 17 is a model diagram of a double-RESURF structure. The double-RESURF structure has a configuration wherein n-type semiconductor region 102 is sandwiched by two p-type semiconductor regions 101 and 103.

A high breakdown voltage can be realized by regulating the net amount of impurities per unit area in a diffusion layer so as to satisfy the following expressions that are double-RESURF conditions, as described in "Design and Optimization of Double-RESURF High-Voltage Lateral Devices for a Manufacturable Process," *IEEE Trans. On Electron Devices*, USA, IEEE, July 2003, vol. 50, no. 7, pp. 1697-1701.

$Qp \leq 1.4 \times 10^{12} [/cm^2]$ $Qn \leq 2.8 \times 10^{12} [/cm^2]$ $Qn - Qp \leq 1.4 \times 10^{12} [/cm^2]$   Expression 1

Herein, Qn is the total amount of impurities per unit area in semiconductor region 102, and Qp is the net amount of impurities per unit area in semiconductor region 103.

The double-RESURF structure is suitable for a realization of a high breakdown voltage, but has a problem in that as its junction area is large, a parasitic capacitance is high. In FIG. 16, when the parasitic capacitance of MOSFETs configuring level shifters 804 is high, a sudden change in voltage generated as a result of a turning on/off of IGBTs 801 and 802, that is, so-called dV/dt noise, allows a large displacement current to flow through level shift resistances 807 via level shifters 804. Because of this, malfunction is liable to occur.

JP-A-2000-252809 describes a circuit of FIG. 18 as a circuit for solving the problem of malfunction due to the dV/dt noise. When the circuit is in normal operation, it does not happen that a voltage drop occurs simultaneously in two level shift resistances 807, but when the dV/dt noise comes into a line Vb, a voltage drop occurs simultaneously in the two level shift resistances 807 when the parasitic capacitances of two level shifters 804 are the same and the values of level shift resistances 807 are the same. The circuit of FIG. 18 is a circuit utilizing this, and is configured to prevent malfunction due to a displacement current by not carrying out a SET/RESET operation when a voltage drop occurs simultaneously in two level shift resistances 807.

FIGS. 19 to 20B are configuration diagrams of a heretofore known semiconductor device having a high voltage isolation structure that is a double-RESURF structure, wherein FIG. 19 is a main portion plan view, FIG. 20A is a main portion sectional view taken along line A-A of FIG. 19, and FIG. 20B is a main portion sectional view taken along line B-B of FIG. 19.

Semiconductor device 500 includes n-type diffusion layer 52 formed on a surface layer of p-type semiconductor substrate 51 and p-type diffusion layer 53 formed on a surface layer of n-type diffusion layer 52. Semiconductor device 500 includes p-type well region 54 formed on the surface layer of n-type diffusion layer 52 so as to be in partial contact with p-type diffusion layer 53 and gate electrode 65 disposed on p-type well region 54 via gate dielectric film 64. Semiconductor device 500 includes n-type source region 57 formed on a surface layer of well region 54 and n-type drain region 59 formed opposite p-type well region 54 in the vicinity of an end portion of p-type diffusion layer 53 on a surface layer of the n-type diffusion layer. N-type drain region 59 is connected to a high potential region by an bonding wire or the like (not shown). P-type diffusion layer 53 is formed having a uniform concentration in a lateral direction of semiconductor substrate 51. Reference numeral 59 in FIGS. 19 to 20B is a drain electrode, 60 is a source electrode, and 61a and 61b are field plates.

In the double-RESURF structure of the heretofore known semiconductor device 500 in FIGS. 19 to 20B, a junction capacitance Cp (parasitic capacitance) between n-type diffusion layer 52 and p-type diffusion layer 53 occupies a large portion of a junction capacitance Cds (parasitic capacitance) between n-type drain region 56 and n-type source region 57. As a configuration is such that the junction capacitance Cp is connected to n-type source region 57 via a diffusion resistance Rp of p-type diffusion layer 53, as shown in FIG. 20B, a displacement current Idis generated when the dV/dt noise is applied to the drain increases when Rp is low.

JP-A-2000-252809 describes that when a simultaneous voltage drop of the load resistances occurs in a level shift circuit that on/off drives an upper arm IGBT of an PWM inverter bridge circuit, malfunction due to dV/dt noise is prevented by providing a NOT circuit that masks an output pulse.

JP-A-2009-277776 provides a (miniaturized) MOSFET wherein a drift region and a RESURF region are formed in a wave shape in a source-drain direction, and a source-drain length is made shorter than heretofore known with a high breakdown voltage maintained.

JP-A-6-204482 describes a MOSFET wherein a RESURF region is formed in a wave shape in order to suppress an increase in ON resistance.

JP-A-2005-175063 describes that a p-type top region and n-type drift layer extend in parallel adjacent to each other, and positive holes flow into the top region and electrons flow into the drift layer, thereby maintaining the charge balance of the drift region in an ON state of the semiconductor device, thus improving a breakdown voltage.

However, as the values of two level shift resistances 807 are normally not completely equal due to process variations in the circuit of FIG. 18, it is not possible to sufficiently prevent malfunction due to the dV/dt noise.

Also, even when level shift resistances 807 are the same, a displacement current flowing through the parasitic capacitance of MOSFET 804 configuring the circuit (the level shifters and the like) increases when dV/dt is great. The displacement current flows through level shift resistances 807, thus increasing a voltage drop in level shift resistances 807. By so doing, a buffer circuit of FIG. 18 is logically inverted, and malfunction of the circuit due to the dV/dt noise occurs.

Also, in the circuit of FIG. 16 too, in the same way, when a displacement current flowing through the parasitic capacitance of MOSFET 804 increases, an RS-FF circuit is logically inverted, and malfunction of the circuit due to the dV/dt noise occurs.

JP-A-2000-252809, JP-A-2009-277776, JP-A-6-204482, and JP-A-2005-175063 do not describe a semiconductor device such that it is possible to reduce a displacement current due to dV/dt by forming a shallow p-type diffusion layer on a double-RESURF structure surface of high concentration regions and low concentration regions, and increasing the lateral resistance of the p-type diffusion layer without changing the amount of electric charges achieving a charge balance.

The present invention is directed to overcoming or at least reducing the effects of one or more of the problems set forth above.

SUMMARY OF THE INVENTION

The invention provides a semiconductor device having a high voltage isolation structure that is a double-RESURF structure, wherein it is possible to reduce a displacement current generated by dV/dt noise, and a method of manufacturing the semiconductor device.

According to an aspect of the invention, in claim 1 a semiconductor device includes a second conductive type first semiconductor layer disposed on a first conductive type semiconductor substrate; a second conducive type drain region selectively formed on a surface layer of the first semiconductor layer; a first conductive type base region selectively formed on the surface layer of the first semiconductor layer so as to be away from the drain region; a first conductive type first well region selectively formed on the surface layer of the first semiconductor layer between the drain region and base region so as to be away from the drain region and in partial contact with the base region; a second conductive type source region selectively formed on a surface layer of the base region; and a gate electrode disposed via a gate dielectric film on a surface of the base region between the source region and first semiconductor layer. A configuration is such that the first well region includes first conductive type low concentration regions and first conductive type high concentration regions with a impurity concentration higher than that of the low concentration regions, and the high concentration regions are separated by the low concentration regions.

According to a further aspect of the invention, in claim 2 a semiconductor device includes a second conductive type first semiconductor layer disposed on a first conductive type semiconductor substrate; a second conducive type drain region selectively formed on a surface layer of the first semiconductor layer; a first conductive type base region selectively formed on the surface layer of the first semiconductor layer so as to be away from the drain region; a first conductive type first well region selectively formed on the surface layer of the first semiconductor layer between the drain region and base region so as to be away from the drain region and in partial contact with the base region; a second conductive type source region selectively formed on a surface layer of the base region; and a gate electrode disposed via a gate dielectric film on a surface of the base region between the source region and first semiconductor layer. A configuration is such that the first well region includes first conductive type low concentration regions and first conductive type high concentration regions with a impurity concentration higher than that of the low concentration regions, and the low concentration regions are formed between the high concentration regions in a source-drain direction of the first well region.

Yet another aspect of the invention is recited in claim 3, wherein in the aspect of the invention of claim 1 or 2, it is preferable that the low concentration regions and high concentration regions of the first well region are alternately disposed in a concentric shape.

According to an aspect of the invention of claim 4, in the aspect of the invention of claim 1 or 2, it is preferable that an embedded insulating film is disposed between the semiconductor substrate and first well region.

According to an aspect of the invention of claim 5, in the aspect of the invention of claim 1 or 2, it is preferable that the number of the low concentration regions is one or more, and the number of the high concentration regions is two or more.

According to an aspect of the invention of claim 6, in the aspect of the invention of claim 1 or 2, it is preferable that the low concentration regions are disposed so as to enclose the high concentration regions.

According to an aspect of the invention of claim 7, a semiconductor device includes a second conductive type first semiconductor layer formed on a first conductive type semiconductor substrate; a first conductive type base region of an annular plan-view shape formed by diffusion on a surface layer of the first semiconductor layer; a first conductive type first well region formed on the inner side of the base region on the surface layer of the first semiconductor layer so as to be in partial contact with the base region; a second conductive type drain region selectively formed on the inner side of the first well region on the surface layer of the first semiconductor layer; a second conductive type source region selectively formed opposite the drain region on the surface layer of the base region; and a gate electrode disposed via a gate dielectric film on the base region between the source region and first semiconductor layer. The semiconductor device has a high voltage isolation structure formed of a double-RESURF structure wherein the first semiconductor layer is sandwiched by the semiconductor substrate and first well region. A configuration is such that the plan-view shape of the upper surface of the high voltage isolation structure is formed of linear portions and corner portions having a fixed curvature, and the first well region in the corner portions includes high concentration regions with a deep diffusion depth and low concentration regions with a shallow diffusion depth, and that the high concentration regions and low concentration regions are alternately formed in an annular shape in a width direction of the first well region.

According to an aspect of the invention of claim 8, a semiconductor device includes a second conductive type first semiconductor layer formed on a first conductive type semiconductor substrate; a first conductive type base region of an annular plan-view shape formed by diffusion on a surface layer of the first semiconductor layer; a first conductive type first well region formed on the inner side of the base region on the surface layer of the first semiconductor layer so as to be in partial contact with the base region; a second conductive type drain region selectively formed on the inner side of the first well region on the surface layer of the first semiconductor layer; a second conductive type source region selectively formed opposite the drain region on the surface layer of the base region; and a gate electrode disposed via a gate dielectric film on the base region between the source region and first semiconductor layer. The semiconductor device has a high voltage isolation structure formed of a double-RESURF structure wherein the first semiconductor layer is sandwiched by the semiconductor substrate and first well region. A configuration is such that the plan-view shape of the upper surface of the high voltage isolation structure is formed of linear portions and corner portions having a fixed curvature, and the first well region in the corner portions includes high concentration regions with a deep diffusion depth and low concentration regions with a shallow diffusion depth, and that the low concentration regions are formed between the high concentration regions in a width direction of the first well region.

According to an aspect of the invention of claim 9, in the aspect of the invention of claim 8, it is preferable that the proportion in surface area of the low concentration regions to the high concentration regions is greater in the corner portions than in the linear portions.

According to an aspect of the invention of claim 10, a method of manufacturing the semiconductor device of any one of claims 1, 2, and 7 to 9 includes a step of forming a second conductive type first semiconductor layer on a first conductive type semiconductor substrate; a step of ion implanting first conductive type impurities using a shielding mask selectively formed on the first semiconductor layer; and a step of performing a heat treatment, thus forming a first conductive type base region and a first conductive type first well region, formed of high concentration regions and low concentration regions formed by lateral diffusion below the shielding mask, partially connected to the base region. A double-RESURF structure is configured by the semiconductor substrate, the first semiconductor layer and the first well region, and a dose amount for forming the first semiconductor layer by ion implantation and a dose amount for forming the first well region by ion implantation satisfy double-RESURF conditions.

According to the invention, by an uppermost surface semiconductor layer configuring a double-RESURF structure being formed so that high concentration regions with a deep diffusion depth and low concentration regions with a shallow diffusion depth are alternately arranged adjacent to each other, it is possible to increase a lateral resistance without changing the total amount of electric charges in the uppermost surface semiconductor layer. As a result of this, it is possible to reduce a displacement current generated by dV/dt noise.

By using MOSFETs of this structure as level shifters, it is possible to prevent malfunction of a semiconductor device such as a high voltage IC due to dV/dt noise. Also, by using a semiconductor substrate on which the MOSFETs are formed as an SOI substrate, it is possible to further reduce a displacement current due to the dV/dt noise.

BRIEF DESCRIPTION OF THE DRAWINGS

The foregoing advantages and features of the invention will become apparent upon reference to the following detailed description and the accompanying drawings, of which:

FIGS. 2A and 2B are sectional views of the semiconductor device according to the first working example of the invention; wherein FIG. 2A is a main portion sectional view taken along line A-A of FIG. 1, and FIG. 2B is a main portion sectional view taken along line B-B of FIG. 1;

FIGS. 9A and 9B are sectional views of the semiconductor device 200 according to the second working example of the invention, wherein FIG. 9A is a main portion sectional view taken along line A-A of FIG. 8, and FIG. 9B is a main portion sectional view taken along line B-B of FIG. 8;

FIGS. 20A and 20B are sectional views of the heretofore known semiconductor device having the high voltage isolation structure that is the double-RESURF structure, wherein FIG. 20A is a main portion sectional view taken along line A-A of FIG. 19, and FIG. 20B is a main portion sectional view taken along line B-B of FIG. 19.

DETAILED DESCRIPTION OF SPECIFIC EMBODIMENTS

An embodiment will be described using the following working examples.

Working Example 1

Figure 1:
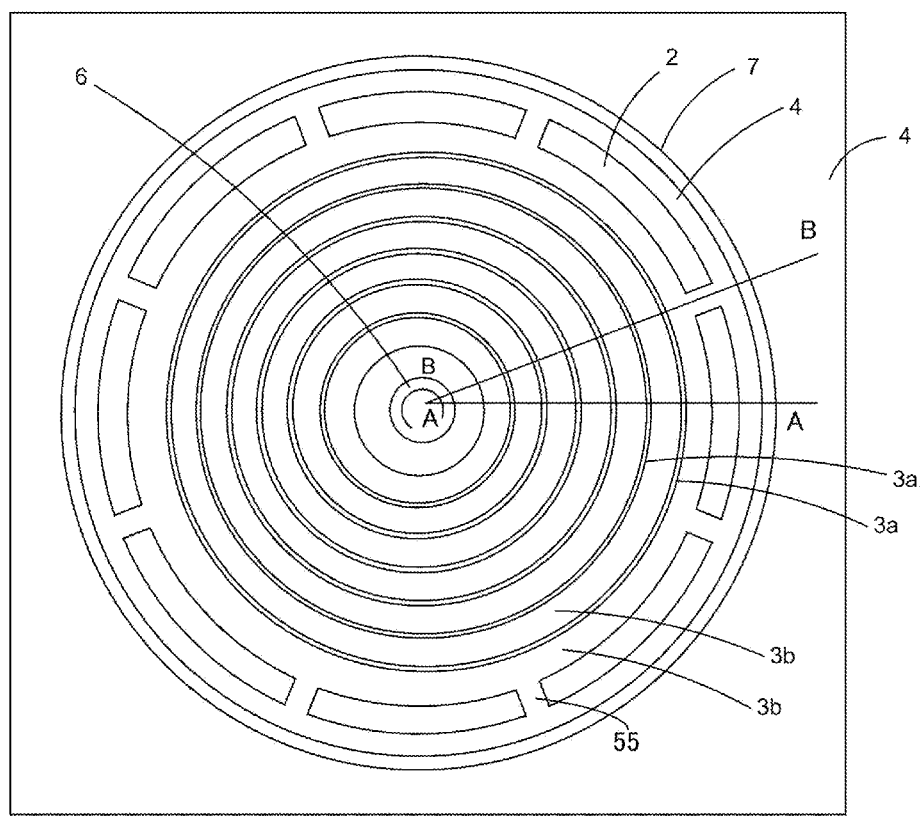
FIG. 1 is a main portion plan view of a semiconductor device according to a first working example of the invention.
Figure 2:
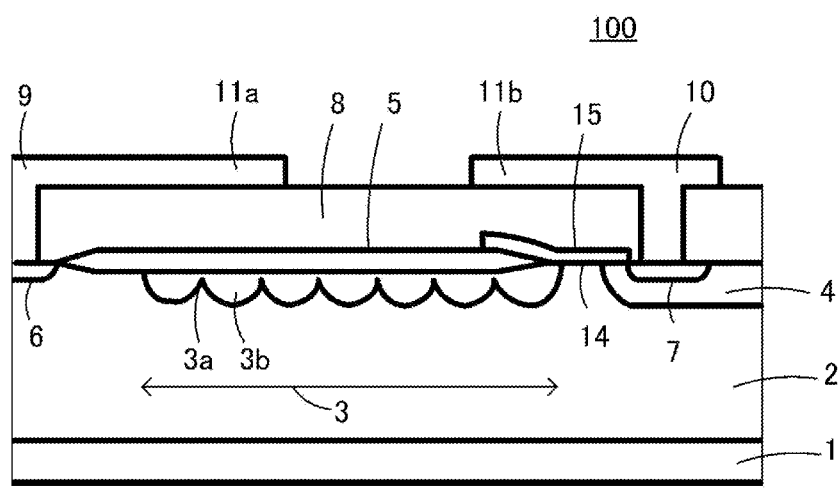
Figure 2:
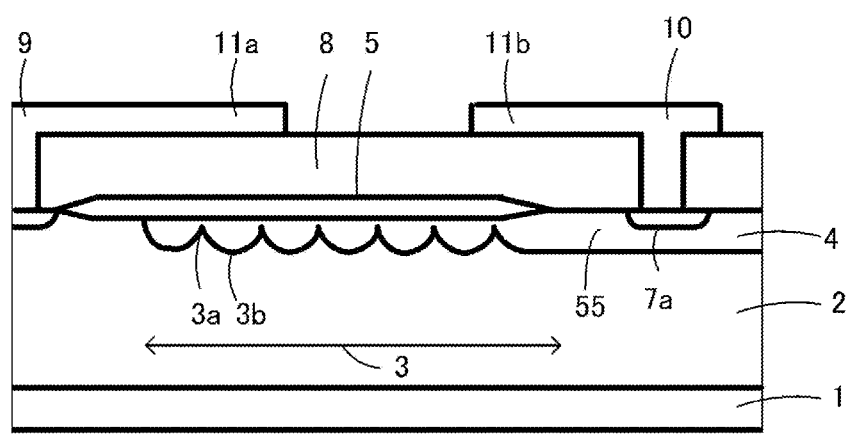

FIGS. 1 to 2B are configuration diagrams of a semiconductor device according to a first working example of the invention, wherein FIG. 1 is a main portion plan view, FIG. 2A is a main portion sectional view taken along line A-A of FIG. 1, and FIG. 2B is a main portion sectional view taken along line B-B of FIG. 1. FIGS. 1 to 2B show a MOSFET used as a level shifter formed in an HVIC described in FIG. 16 or 18. The MOSFET is formed in a low potential region, and drain electrode 9 is connected to a high potential region by a bonding wire (not shown). Also, the outer peripheral end of p-type well region 4 acting as the low potential region is shown in a circular shape here but, not being limited to this, expands outward to any size.

Semiconductor device 100 includes n-type semiconductor layer 2 formed on a surface layer of p-type semiconductor substrate 1 and p-type diffusion layer 3 formed on a surface layer of n-type semiconductor layer 2. N-type semiconductor layer 2 may be a diffusion layer formed on the surface layer of p-type semiconductor substrate 1 by diffusion, or may be an epitaxial growth layer epitaxially grown on p-type semiconductor substrate 1. Furthermore, semiconductor device 100 includes p-type well region 4 formed on the surface layer of n-type semiconductor layer 2 so as to be in partial contact with p-type diffusion layer 3 and gate electrode 15 disposed on p-type well region 4 via gate dielectric film 14. Semiconductor device 100 includes n-type source region 7 formed on a surface layer of p-type well region 4 and n-type drain region 6 formed opposite p-type well region 4 in the vicinity of an end portion of p-type diffusion layer 3. P-type diffusion layer 3 and p-type well region 4 are connected by connection portion 55 that is a p-type region so as to prevent p-type diffusion layer 3 from becoming a floating region.

Figure 3:
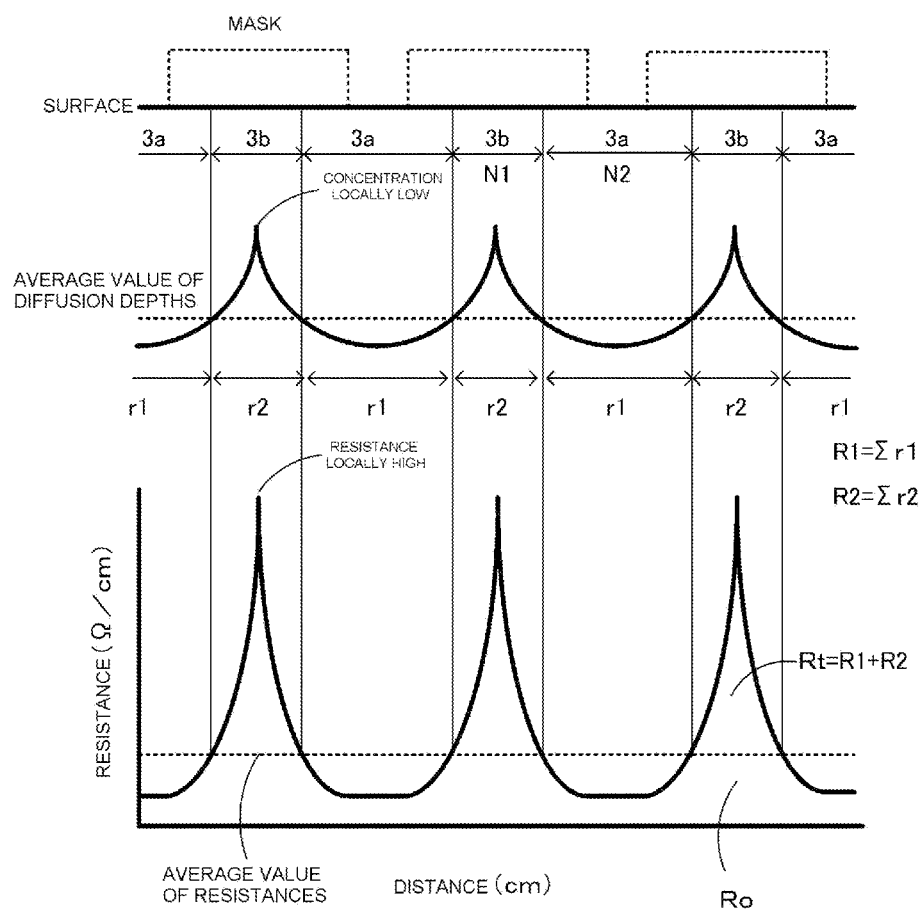
FIG. 3 is an outline illustration illustrating the lateral resistance of p-type diffusion layer 3 wherein p-type low concentration regions 3a and p-type high concentration regions 3b are alternately disposed in a concentric shape so as to be in contact with each other.

P-type diffusion layer 3 is formed of concentric zonal p-type low concentration regions 3a and p-type high concentration regions 3b. P-type low concentration regions 3a and p-type high concentration regions 3b are alternately formed, thus forming a waved bottom surface of p-type diffusion layer 3, and p-type high concentration regions 3b are isolated by p-type low concentration regions 3a. As shown in FIG. 3, regions shallower than the average value of diffusion depths (a value wherein a value obtained by integrating diffusion depths over a lateral distance is divided by the lateral distance) is taken to be p-type low concentration regions 3a, and deeper regions are taken to be p-type high concentration regions 3b. Reference numeral 5 in FIGS. 2A and 2B is a LOCOS film, 9 is the drain electrode, 10 is a source electrode, and 11a and 11b are field plates.

Semiconductor device 100 has a double-RESURF structure formed of p-type diffusion layer 3, n-type semiconductor layer 2, and p-type semiconductor substrate 1, and n-type semiconductor layer 2 is a high potential region, while p-type well region 4 is a low potential region. Semiconductor device 100 is a high voltage IC or the like, having a high voltage MOSFET (herein, a level shifter MOSFET is taken as an example), wherein various kinds of circuit are formed in the high potential region and low potential region.

FIG. 3 is an outline illustration illustrating a lateral resistance when p-type low concentration regions 3a and p-type high concentration regions 3b are alternately disposed in a concentric shape in contact with each other, thus forming the waved bottom surface of p-type diffusion layer 3.

The sum of the net total amounts of impurities in a plurality of p-type low concentration regions 3a is taken to be Fp1, the sum of the net total amounts of electric charges Qp1 (=Fp1), and the sum of lateral resistances (r1) R1, while the sum of the net total amounts of impurities in a plurality of p-type high concentration regions 3b is taken to be Fp2, the sum of the net total amounts of electric charges Qp2 (=Fp2), and the sum of lateral resistances (r2) R2. Also, the net total amount of impurities combined in p-type low concentration regions 3a and p-type high concentration regions 3b is taken to be Ft, the net total amount of electric charges combined Qt, and a lateral resistance combined Rt. The "net" represents an amount of diffusion profile impurity concentrations integrated by an amount equivalent to the thickness of each layer, referring to the amount of difference between the amount of p-type impurities and the amount of n-type impurities. The diffusion profile is represented by the amount of difference.

$$Ft=Fp1+Fp2, Qt=Qp1+Qp2, \text{ and } Rt=R1+R2.$$

When the concentration of p-type low concentration regions 3a is locally reduced without changing Ft, it is possible to increase R1>>R2. Meanwhile, a lateral resistance when p-type diffusion layer 3 is formed having a fixed impurity concentration (flat) in the lateral direction of p-type diffusion layer 3 is taken to be R0. The net total amount of impurities (flat) at this time is made equal to Ft (waved), and the net total amount of electric charges (flat) is made equal to Qt (waved). That is, the net total amount of electric charges (flat) and Qt (waved) having an effect on a breakdown voltage are the same and not changed.

Further, p-type diffusion layer 3 is configured by p-type low concentration regions 3a and p-type high concentration regions 3b, and when R1>>R2, Rt is determined by R1, resulting in Rt>R1>R0. That is, it is possible to increase the lateral resistance without changing the net total amount of electric charges. Specific contents will be described hereafter.

As heretofore described, it is possible, owing to the existence of p-type low concentration regions 3a (when the bottom surface is waved), to make a diffusion resistance Rp that is the lateral resistance in the drain-source direction of p-type diffusion layer 3 higher than that in a heretofore known structure (when the bottom surface is flat) without changing the total amount of electric charges having an effect on the breakdown voltage.

In the invention, as it is possible to increase the resistance Rt corresponding to Rp in the double-RESURF structure of heretofore known semiconductor device 500, it is possible to reduce a displacement current Idis generated when dV/dt noise is applied to the drain.

Next, a specific description will be given of the lateral resistance of p-type diffusion layer 3.

The lengths (referring to the widths of the zones) of p-type low concentration regions 3a and p-type high concentration regions 3b are respectively taken to be, for example, 1 μm and 4 μm per cycle (per annular zone), and shallow p-type diffusion layer 3 with a length of 200 μm is configured by 40 cycles' worth of p-type low concentration regions 3a and p-type high concentration regions 3b being alternately brought together. FIG. 2 shows only seven cycles' worth of p-type low concentration regions 3a and p-type high concentration regions 3b for sake of simplicity. A width W (the length of one cycle of the zone) of shallow p-type diffusion layer 3 is taken to be 100 μm. The effective acceptor concentration (net total amount of electric charges Qp1) of p-type low concentration regions 3a and the effective acceptor concentration (net total amount of electric charges Qp2) of p-type high concentration regions 3b are taken to be Qp1=6×10$^{10}$/cm$^2$ and Qp2=6×10$^{11}$/cm$^2$ respectively, and the effective donor concentration (a net total amount of electric charges Qn) of deep n-type semiconductor layer 2 is taken to be Qn=1.2×10$^{12}$/cm$^2$. The "effective donor concentration" and "effective acceptor concentration" each refer to the net total amount of electric charges (cm$^{-2}$) per unit area in the double-RESURF structure.

The diffusion resistance Rp that is the lateral resistance of shallow p-type diffusion layer 3 in this structure is represented by an expression (1) as the sum of a diffusion resistance Rp1 of p-type low concentration regions 3a and a diffusion resistance Rp2 of p-type high concentration regions 3b.

Expression 2

$$R_p = R_{p1} + R_{p2} = \frac{NL_1}{\mu_h q Q_{p1} W} + \frac{NL_2}{\mu_h q Q_{p2} W} \quad (1)$$

Herein, $\mu_h$ is a Hall mobility and is here taken to be 400 cm$^2$/Vs. Also, q is a quantum of electricity, $L_1$ and $L_2$ are the widths of the zones of the p-type low concentration regions 3a and p-type high concentration regions 3b respectively, N is a cycle, and W is the length of one cycle of the zone. The previously mentioned N/μqQ is a sheet resistance (Ω/□).

By inserting the above mentioned numeral values into the variables in the expression (1), Rp=12KΩ can be obtained as the diffusion resistance Rp of shallow p-type diffusion layer 3. The diffusion resistance Rp when the total amount of electric charges in p-type diffusion layer 3 is made the same as that in this working example in the heretofore known structure in which there exists no p-type low concentration region 3a can be obtained by taking Qp$_2$=Qp$_1$ to be 5.2×10$^{11}$/cm$^2$ in the expression (1), thus resulting in Rp=6KΩ. Consequently, in this working example, by introducing p-type low concentration regions 3a, it is possible to double the diffusion resistance Rp without changing the total amount of electric charges in p-type diffusion layer 3.

Next, a quantitative description will be given of the effect of suppressing a displacement current owing to an increase in the diffusion resistance Rp.

Figure 4:
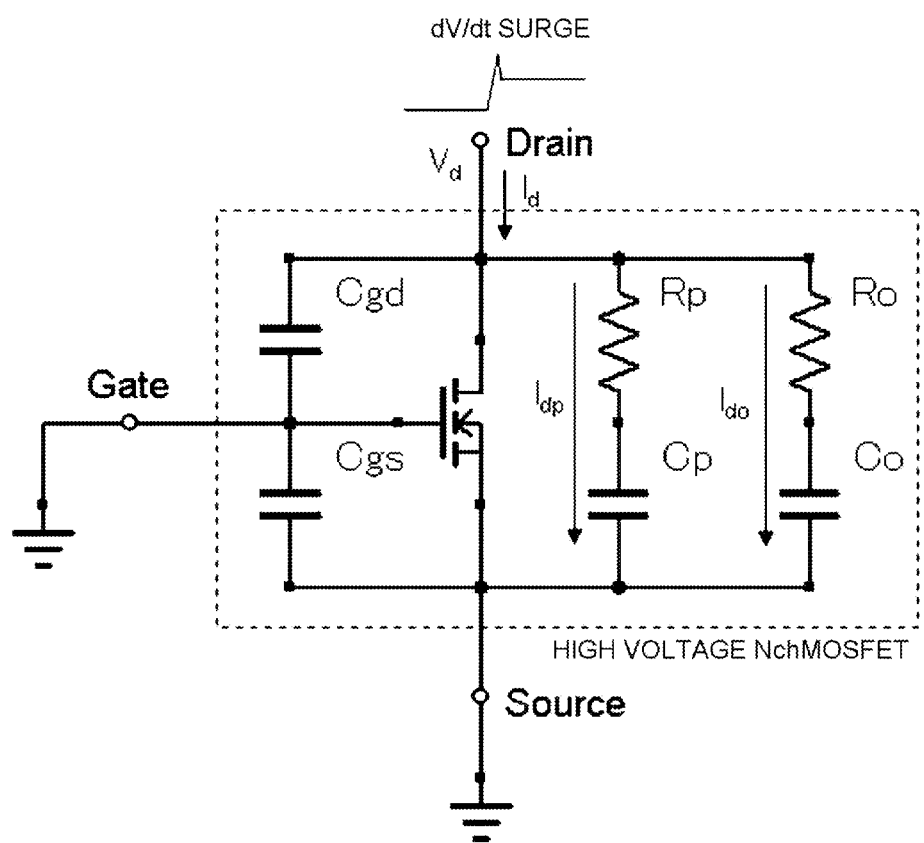
FIG. 4 is an equivalent circuit diagram of a high voltage Nch MOSFET of a double-RESURF structure.

An equivalent circuit of a double-RESURF structure high voltage Nch MOSFET is shown in the dotted frame of FIG. 4. Cp is a parasitic capacitance generated by the junction of shallow p-type diffusion layer 3 and deep n-type semiconductor layer 2, and Co is a drain-source parasitic capacitance generated by the junction of others. Rp and Ro are parasitic resistances generated by the diffusion resistance or the like, Cgd is a gate-drain parasitic capacitance, and Cgs is a gate-source parasitic capacitance.

The relationship of each physical amount when dV/dt surge that is dV/dt noise comes into the drain in the circuit of FIG. 4 is represented by the differential equation of an expression (2). Note that, herein, Cgd is taken to be sufficiently small with respect to Cp and Co, and a current flowing from the drain to the gate is taken to be 0.

Expression 3

$$I_d = I_{dp} + I_{do} = C_p \frac{d}{dt}(V_d - I_{dp} R_p) + C_o \frac{d}{dt}(V_d - I_{do} R_o) \quad (2)$$

The displacement current when the dV/dt surge comes in can be obtained by solving the differential equation, and is represented by an expression (3).

Expression 4

$$I_d(t) = I_{dp}(t) + I_{do}(t) = C_p \frac{dV_d}{dt}\left(1 - e^{-\frac{t}{R_p C_p}}\right) + C_o \frac{dV_d}{dt}\left(1 - e^{-\frac{t}{R_o C_o}}\right) \quad (3)$$

When the duration time of the dV/dt surge is taken to be $t_1$, the maximum value of the displacement current when the dV/dt surge comes in is represented by Id($t_1$).

Figure 5:
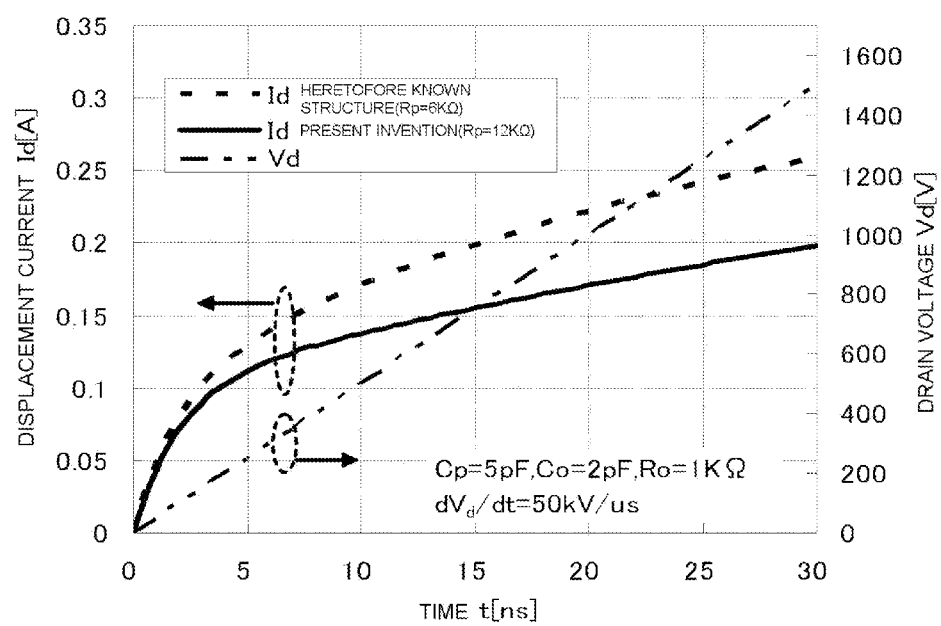
FIG. 5 is a diagram wherein displacement currents of a structure of the working example and a heretofore known structure are computed.

FIG. 5 shows results wherein the displacement currents in the structure of this working example and the heretofore known structure are computed using the expression (3). Parameters are assumed to be Cp=5 pF, Co=2 pF, Ro=1 kΩ, and dV$_d$/dt=50 kV/μs. V$_d$ is a drain voltage, and herein, dV$_d$/dt means the dV/dt surge.

When the duration time $t_1$ of the dV/dt surge is taken to be 30 ns, the displacement current in the heretofore known structure is a maximum of 60 mA, while that in the structure of this working example is 200 mA, and a result 23% lower than in the heretofore known structure can be obtained. In this way, by increasing the diffusion resistance Rp, it is possible to suppress the displacement current when the dV/dt surge is generated.

Figure 6:
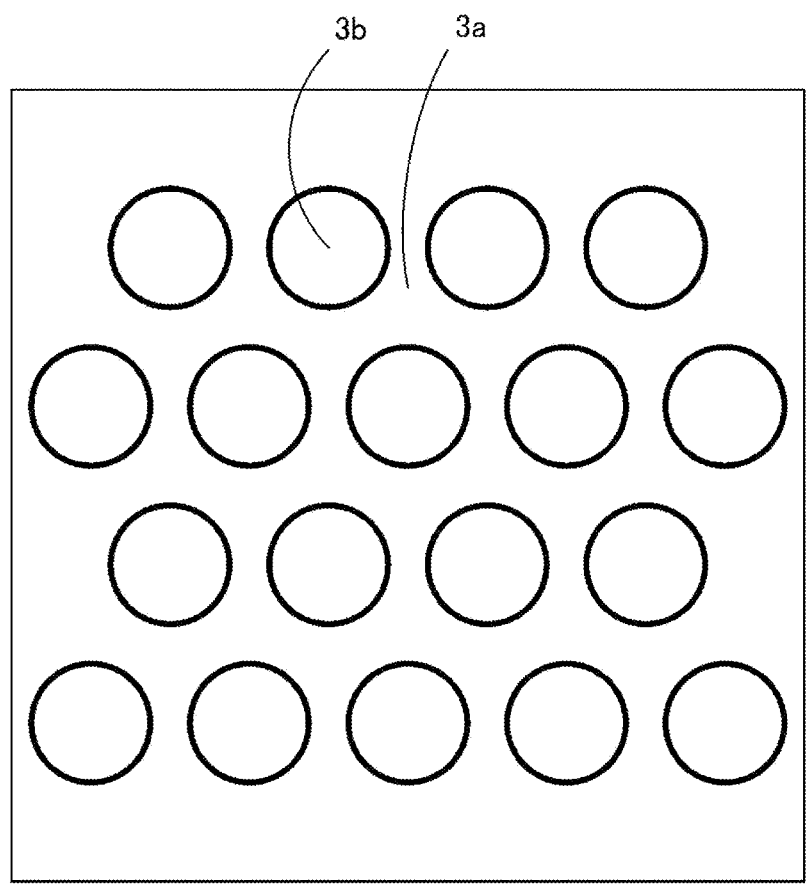
FIG. 6 is a main portion plan view wherein p-type high concentration regions 3b of p-type diffusion layer 3 are disposed in a dot shape.

FIG. 6 is a main portion plan view of p-type diffusion layer 3 of which p-type low concentration regions 3a and p-type high concentration regions 3b are disposed differently from in FIG. 1. P-type diffusion layer 3, being such that dot-shaped p-type high concentration regions 3b are enclosed by p-type low concentration region 3a, is configured of one p-type low concentration region 3a and a plurality of p-type high concentration regions 3b. In this case too, it is possible to obtain advantages the same as those in FIG. 1.

Semiconductor device 100 in FIGS. 1 to 2B, the application thereof not being limited to a level shifter, can be applied to any circuit whose malfunction is intended to be prevented by reducing the displacement current generated by the dV/dt noise.

Working Example 2

Figure 7:
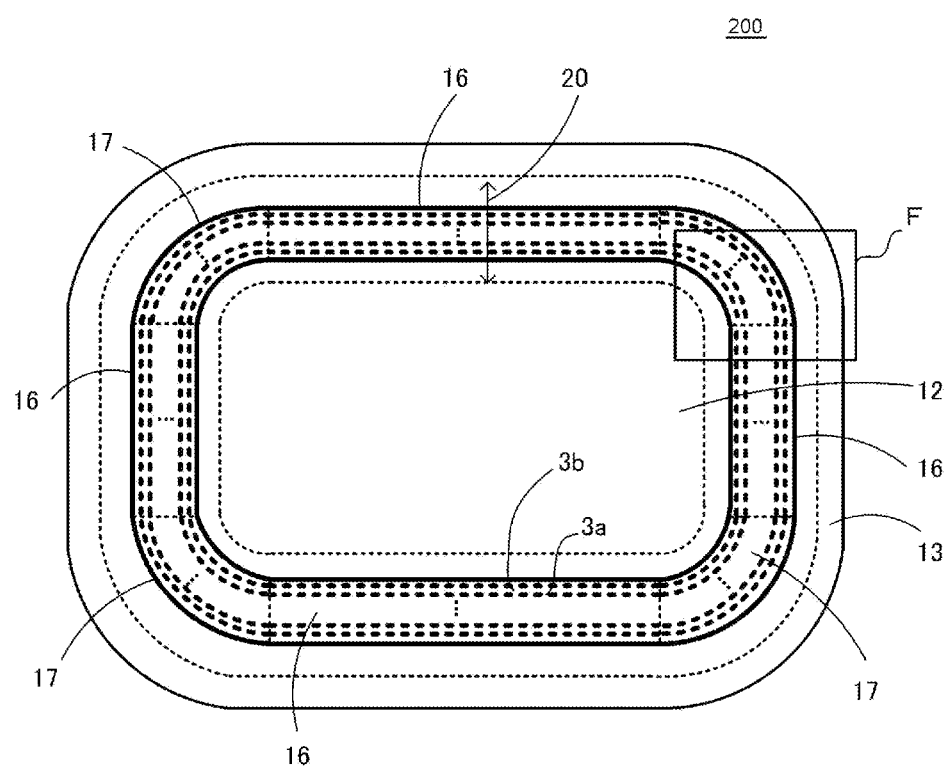
FIG. 7 is a main portion plan view of semiconductor device 200 according to a second working example of the invention.
Figure 8:
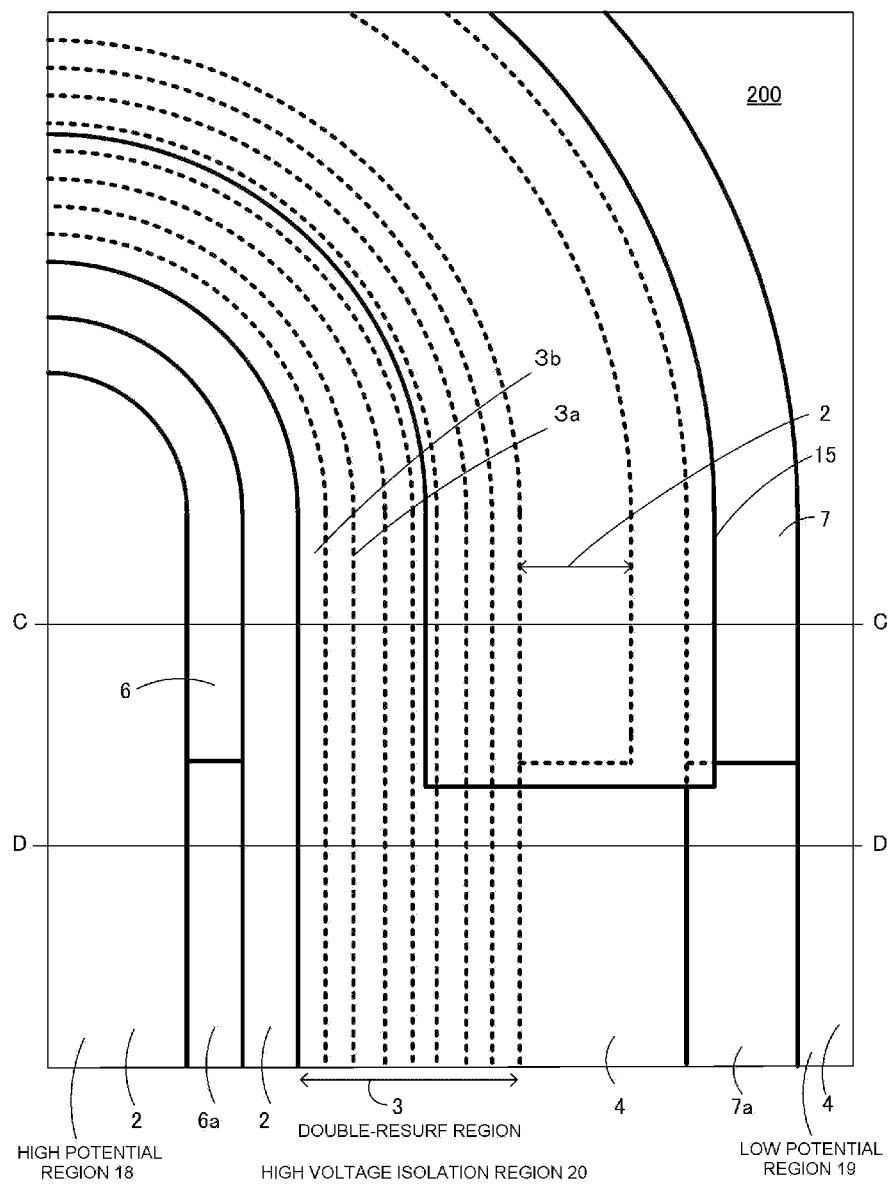
FIG. 8 is an enlarged main portion plan view of an F portion in FIG. 7.
Figure 9:
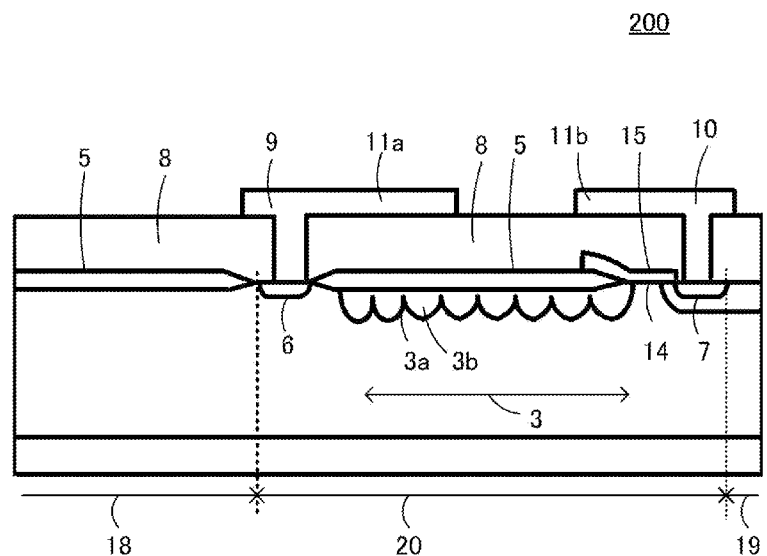
Figure 9:
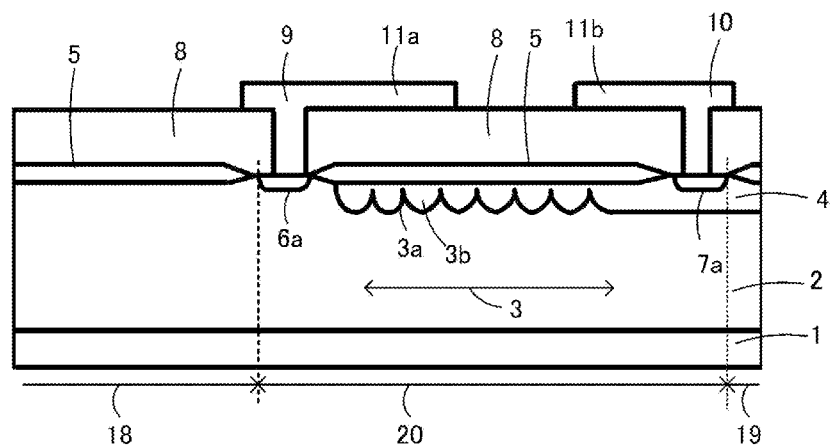

FIGS. 7 to 9B are configuration diagrams of a semiconductor device 200 according to a second working example of the invention, wherein FIG. 7 is a main portion plan view, FIG. 8 is an enlarged main portion plan view of an F portion in FIG. 7, FIG. 9A is a main portion sectional view taken along line C-C of FIG. 8, and FIG. 9B is a main portion sectional view taken along line D-D of FIG. 8.

In FIG. 7, high voltage isolation structure 20, having an annular zonal shape with a fixed width in a plan view, encloses high potential region 18. The plan-view outline of high voltage isolation structure 20 includes linear portions 16 and corner portions 17 having a curved shape with a fixed curvature. The width of high voltage isolation structure 20 is approximately 200 μm, and the curvature radius of corner portions 17 is approximately 80 μm.

Figure 16:
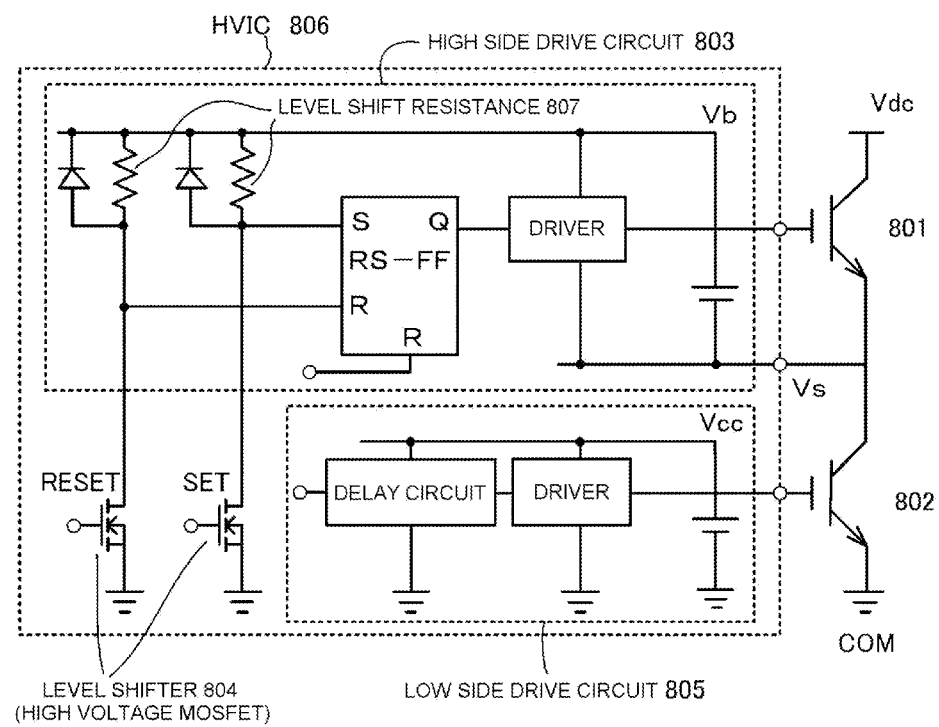
FIG. 16 is a common gate drive circuit diagram of a high voltage IC.
Figure 17:
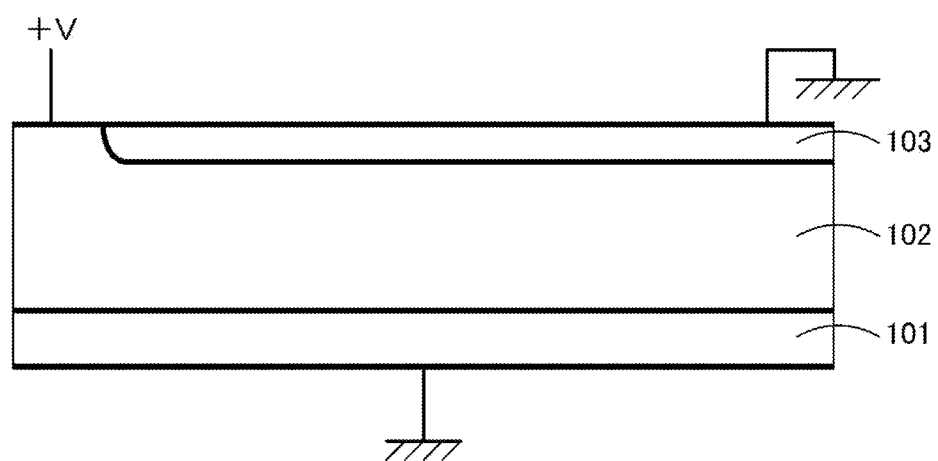
FIG. 17 is a model diagram of a double-RESURF structure.

The difference from semiconductor device 100 of the first working example is that a level shift MOSFET is formed in high voltage isolation structure 20. High potential region 18 is enclosed by high voltage isolation structure 20, and low potential region 19 is formed on the outer side of high voltage isolation structure 20. A high side drive circuit shown in FIG. 16 is formed in the high potential region 18. P-type diffusion layer 3 of the MOSFET is formed extending in the high voltage isolation structure 20. P-type diffusion layer 3 is such that p-type high concentration regions 3*b* and p-type low concentration regions 3*a* are alternately disposed, and the p-type high concentration regions 3*b* are separated by the p-type low concentration regions 3*a*. Each of p-type high concentration regions 3*b* and p-type low concentration regions 3*a* is formed in an annular shape.

The reason for p-type low concentration regions 3*a* and p-type high concentration regions 3*b* to be formed extending in a region other than the MOSFET is because a junction capacitance in the region other than the MOSFET is also connected to the drain and source via n-type semiconductor layer 2 and a p-type well region, and forms one portion of the parasitic capacitance of the MOSFET.

In this case too, it is possible to obtain advantages the same as those in the first working example. Elements 6*a* and 7*a* in FIGS. 7 to 9B are an n⁺region and a p⁺region for making contact.

Working Example 3

Figure 10:
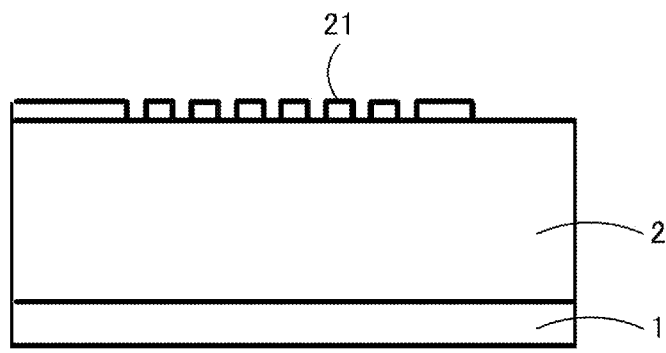
FIGS. 10A to 10C, showing a method of manufacturing a semiconductor device according to a third working example of the invention, are main portion manufacturing process sectional views shown in a process order.
Figure 10B:
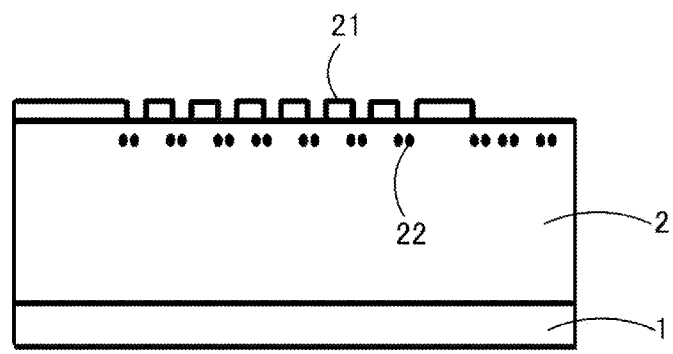
Figure 10:
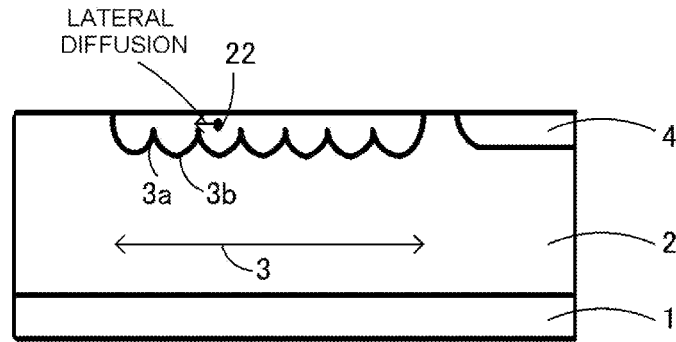

FIGS. 10A to 10C, showing a method of manufacturing a semiconductor device according to a third working example of the invention, are main portion manufacturing process sectional views shown in a process order. Herein, FIGS. 10A to 10C show a process of manufacturing the semiconductor device 200 of the second working example. The manufacturing process sectional views correspond to the sectional view of FIG. 9A. Also, herein, FIGS. 10A to 10C show steps of using a shielding mask to form the p-type low concentration regions 3*a* and p-type high concentration regions 3*b* configuring p-type diffusion layer 3.

Resist mask 21 acting as a shielding mask is formed on a surface of n-type semiconductor layer 2 (FIG. 10A). Next, boron 22 is ion implanted. The dose amount is set to an optimal value (a dose amount wherein a breakdown voltage is highest) satisfying double-RESURF conditions (FIG. 10B).

After resist mask 21 is removed, a heat treatment is performed to form p-type high concentration regions 3*b*, and boron 22 ion implanted in a place below resist mask 21 is diffused in a lateral direction, thereby forming p-type low concentration regions 3*a*. Normally, the distance of diffusion caused by the heat of impurities is in the order of 80% in the lateral direction (a direction parallel to a silicon plane) relative to a vertical direction (a depth direction) (FIG. 10C).

Working Example 4

Figure 11:
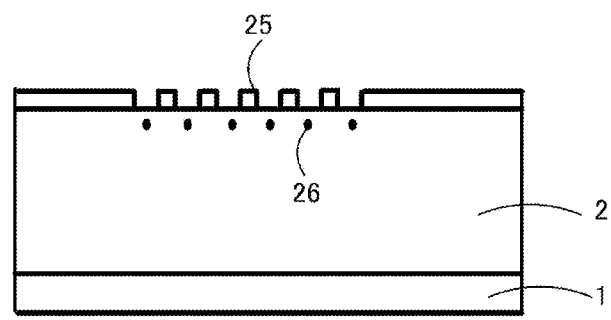
FIGS. 11A to 11C, showing a method of manufacturing a semiconductor device according to a fourth working example of the invention, are main portion manufacturing process sectional views shown in a process order.
Figure 11:
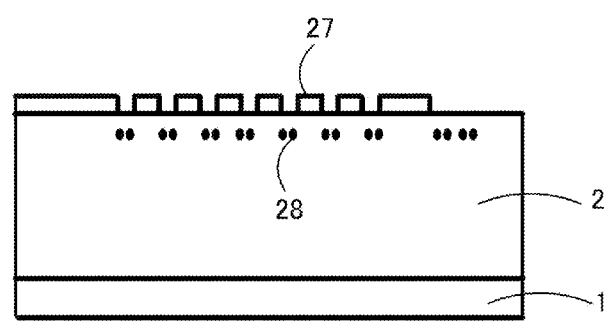
Figure 11:
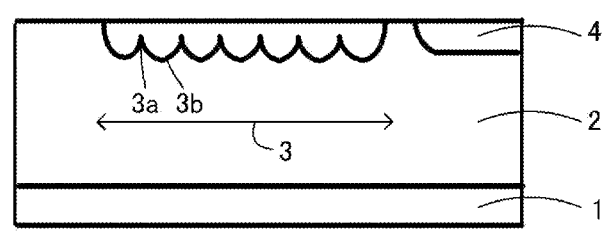

FIGS. 11A to 11C, showing a method of manufacturing a semiconductor device according to a fourth working example of the invention, are main portion manufacturing process sectional views shown in a process order. Herein, FIGS. 11A to 11C show a process of forming the low concentration regions and high concentration regions configuring p-type diffusion layer 3 by diffusion.

Resist mask 25 acting as a shielding mask is formed on a surface of n-type semiconductor layer 2, and a low dose amount of boron 26 is ion implanted (FIG. 11A). Next, resist mask 25 is removed, new resist mask 27 is formed on a surface of p-type diffusion layer 3, and a high dose amount of boron 28 is ion implanted. However, boron 26 is omitted to avoid complexity (FIG. 11B).

After resist mask 27 is removed, a heat treatment is performed to form p-type low concentration regions 3*a* and p-type high concentration regions 3*b* (FIG. 11C).

A dose amount wherein the low dose amount and high dose amount are added together is set to be an optimal amount satisfying the double-RESURF conditions.

Working Example 5

Figure 12:
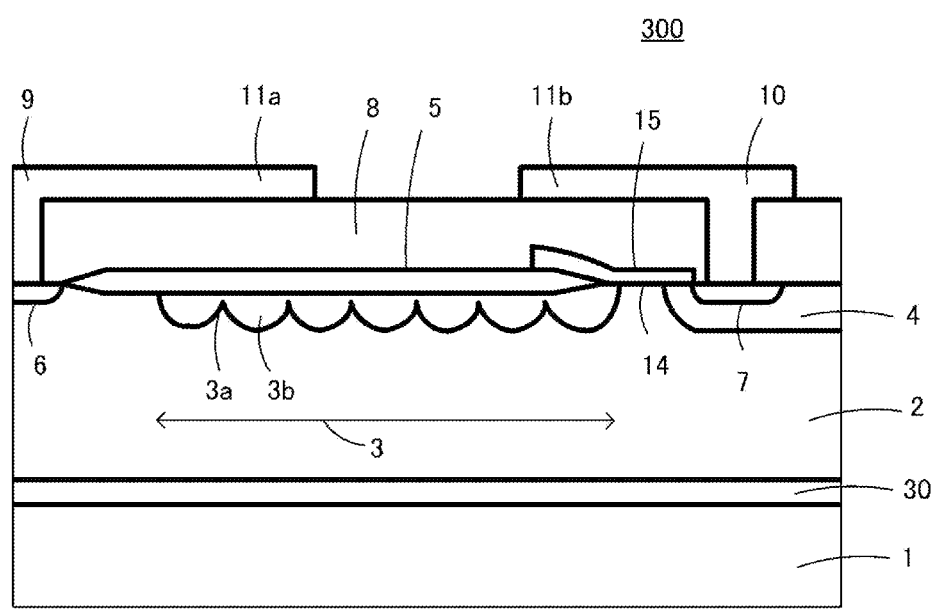
FIG. 12 is a main portion sectional view of a semiconductor device 300 according to a fifth working example of the invention.

FIG. 12 is a main portion sectional view of a semiconductor device 300 of a fifth working example of the invention. The difference from semiconductor device 100 of the first working example is that embedded oxide film 30 is formed between n-type semiconductor layer 2 and p-type semiconductor substrate 1. This is a case wherein semiconductor device 300 is formed using an SOI substrate, and the other structures are the same as those in the first working example. In this structure, a quasi-double-RESURF structure is configured by p-type diffusion layer 3, n-type semiconductor layer 2, and embedded oxide film 30.

In the structure of this working example, as the junction of deep n-type semiconductor layer 2 and p-type semiconductor substrate 1 that leads mainly to the parasitic capacitance Co in the structure of the first working example does not exist, the parasitic capacitance Co is low. Because of this, in this working example, it is possible to further suppress a displacement current than in the first working example.

Working Example 6

Figure 13:
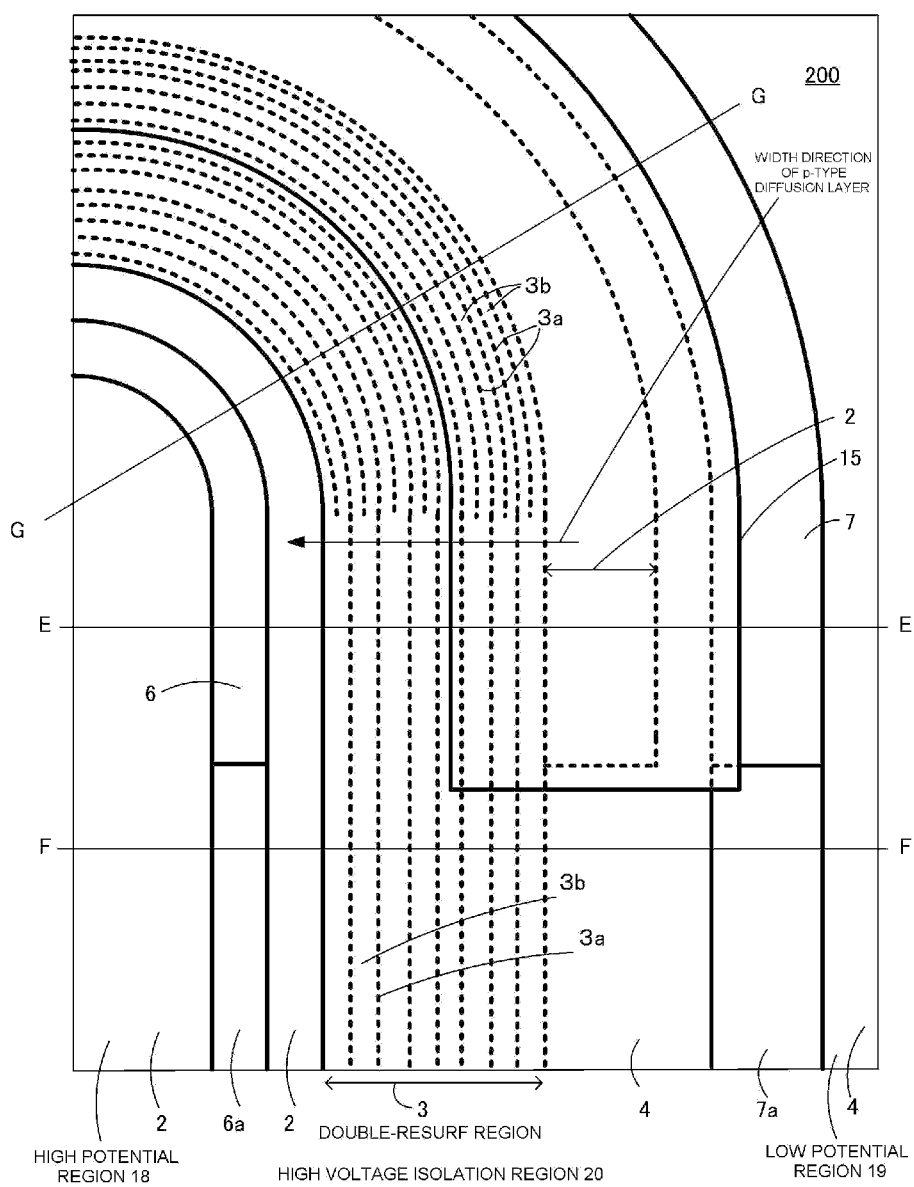
FIG. 13, being a configuration diagram of a semiconductor device 400 according to a sixth working example of the invention, is an enlarged main portion plan view of another example of an F portion in FIG. 7.
Figure 14:
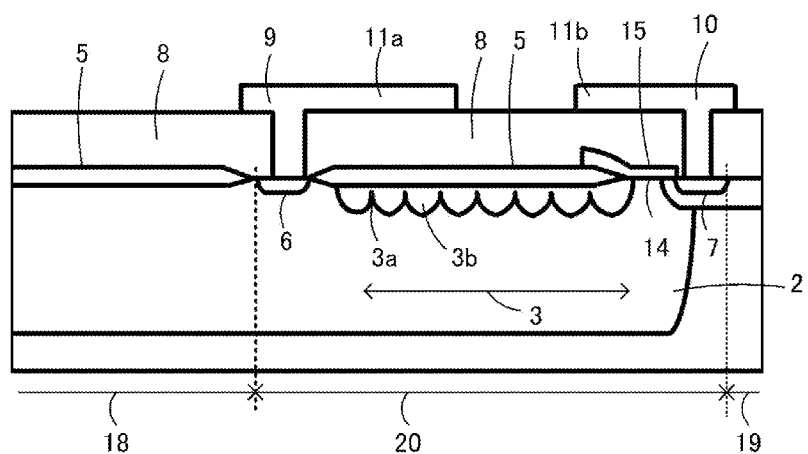
FIG. 14A is a main portion sectional view taken along line A-A of FIG. 13.
FIG. 14B is a main portion sectional view taken along line C-C of FIG. 13.
Figure 14:
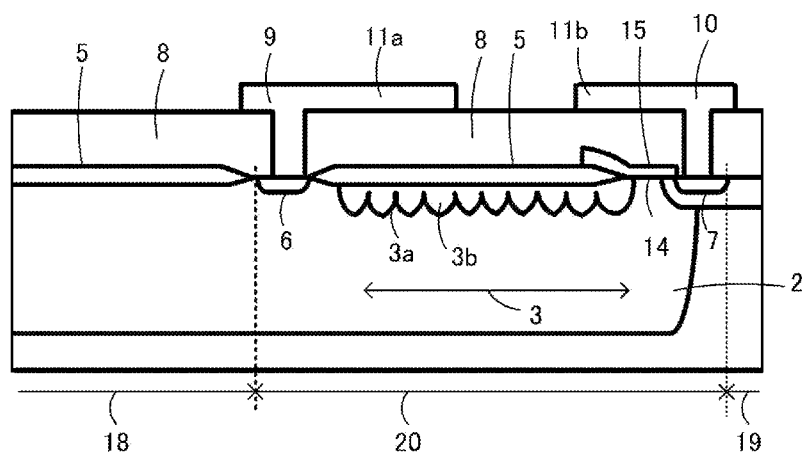

FIGS. 13 to 14B are configuration diagrams of semiconductor device 400 according to a sixth working example of the invention, wherein FIG. 13 is an enlarged main portion plan view of another example of an F portion in FIG. 7, FIG. 14A is a main portion sectional view taken along line E-E of FIG. 13, and FIG. 14B is a main portion sectional view taken along line G-G of FIG. 13. A main portion sectional view taken along line F-F of FIG. 13 is the same as FIG. 8B.

The differences from semiconductor device 200 of the second working example are that only an n-type semiconductor layer formed by diffusion is targeted as n-type semiconductor layer 2, and that the number of zones of p-type low concentration regions 3*a* and p-type high concentration regions 3*b* of linear portions 16 is smaller than the number of zones of respective p-type low concentration regions 3*a* and p-type high concentration regions 3*b* of corner portions 17. Hereafter, a description will be given of a specific manufacturing method.

Firstly, ion implantation for forming n-type semiconductor layer 2 on a surface layer of silicon-based p-type semiconductor substrate 1 with a resistivity of 400 Ωcm is carried out using P (phosphorus) ions on the conditions of an acceleration energy of 50 keV and a dose amount of $4.0 \times 10^{12}/cm^2$.

Next, ion implantation for forming p-type well region 4 is carried out using B (boron) ions on the conditions of an acceleration energy of 50 keV and a dose amount of $4.0 \times 10^{12}/cm^2$. Then heat diffusion is carried out at a treatment temperature of 1200° C. for a treatment time of 300 minutes, thus forming n-type semiconductor layer 2 and p-type well region 4.

Next, ion implantation for forming p-type diffusion layer 3 is carried out using B ions on the conditions of an acceleration energy of 50 keV and a dose amount of $7.0\times10^{12}/cm^2$. At this time, the amount of B ion impurities per unit area infiltrating into the silicon in linear portions 16 is $7.0\times10^{12}/cm^2$. A mask is formed in such a way that the amount of impurities per unit area infiltrating into the silicon is 10% smaller in corner portions 17 than in linear portions 16. The mask is formed from a resist, as shown in the third working example. Therefore, the amount of B ion impurities per unit area infiltrating into the silicon in corner portions 17 is substantially $6.3\times10^{12}/cm^2$.

As shown in FIG. 7, it is desirable that p-type low concentration regions 3a and p-type high concentration regions 3b are formed in an annular plan-view shape. As a method of making the dose amount smaller in corner portions 17 than in linear portions 16, a mask is formed using a resist mask in such a way that the number of zones of p-type low concentration regions 3a and p-type high concentration regions 3b are further increased in corner portions 17 than in linear portions 16. By so doing, it is possible to increase a masked area per unit area in corner portions 17 and reduce the amount of impurities infiltrating into the silicon.

The masked area per unit area in corner portions 17 is made 10% smaller than the masked area per unit area in linear portions 16, but this can be appropriately changed in accordance with the depth of n-type semiconductor layer 2, the curvature radius of corner portions 17, and the like.

Next, heat diffusion is carried out at a temperature of the order of 1150° C. for a time of in the order of 240 minutes, thus forming p-type diffusion layer 3.

After a silicon nitride film is formed by a low pressure chemical vapor deposition (LPCVD) method, an etching is performed with one portion of the silicon nitride film on n-type semiconductor layer 2 and p-type diffusion layer 3 being left behind. A heat treatment is carried out in an oxygen atmosphere with a temperature of 1000° C., thus forming LOCOS film 5.

Then As (arsenic) ions are implanted into an active region on n-type semiconductor layer 2 and a surface layer of p-type diffusion layer 3, thus forming n-type drain region 6, n$^+$ region 6a, and n-type source region 7. Next, $BF_2$ (boron fluoride) ions are implanted into the surface layer of p-type diffusion layer 3, thus forming e p$^+$ region 7a.

After interlayer dielectric film 8 is formed, a heat treatment is carried out, and an activation of the As ions and $BF_2$ ions is carried out. Then, after a contact hole is formed on n-type drain region 6, n$^+$ region 6a, n-type source region 7, and p$^+$ region 7a by a reactive ion etching (RIE), an aluminium film is formed by a sputtering. Subsequently, an etching of the aluminium film is carried out, thus forming drain electrode 9, source electrode 10, field plate 11a, and field plate 11b.

A high voltage isolation structure wherein the amount of impurities per unit area in p-type diffusion layer 3 of corner portions 17 is smaller than the amount of impurities per unit area in p-type diffusion layer 3 of linear portions 16 is formed by the above process. As a result of this, it is possible to realize a high breakdown voltage by making the dose amounts in corner portions 17 and linear portions 16 the same and making masks when implanting ions different between in corner portions 17 and in linear portions 16.

Figure 15:
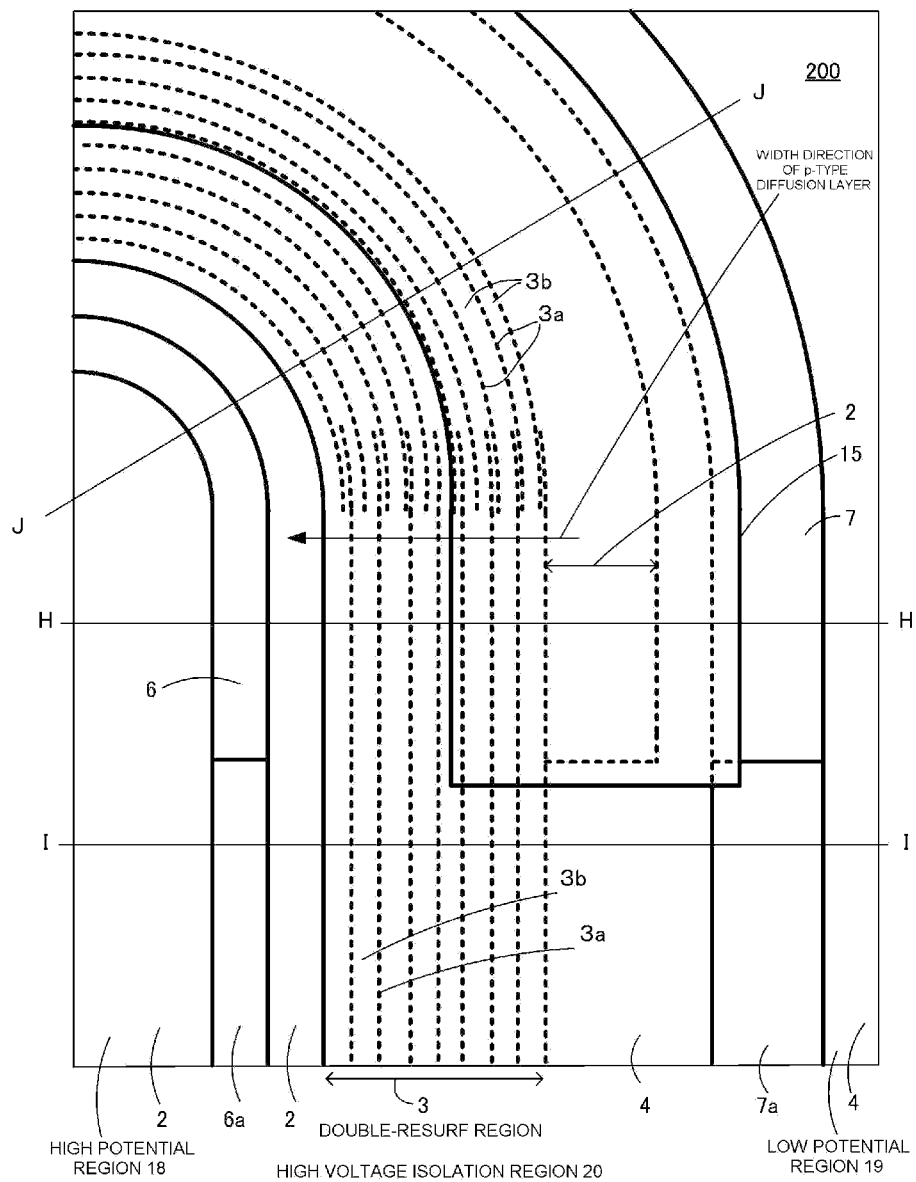
FIG. 15 is an enlarged main portion plan view of another example of the F portion in FIG. 7.

FIG. 15 is an enlarged main portion plan view of another example of the F portion in FIG. 7. A main portion sectional view taken along line H-H of FIG. 13 is the same as FIG. 14A, a main portion sectional view taken along line J-J of FIG. 13 is the same as FIG. 14B, and a main portion sectional view taken along line F-F of FIG. 13 is the same as FIG. 8B.

In the same way as in FIG. 13, the number of zones of p-type low concentration regions 3a and p-type high concentration regions 3b in linear portions 16 is smaller than the number of zones of respective p-type low concentration regions 3a and p-type high concentration regions 3b in corner portions 17.

The boundary between corner portion 17 and linear portion has a place in which low concentration regions 3a are not continuously formed, and high concentration regions 3b are not separated. However, it is sufficient that low concentration regions 3a are formed between high concentration regions 3b in a width direction (a source-drain direction) of p-type diffusion layer 3, and a resistance in the width direction of p-type diffusion layer 3 is sufficiently high.

In the same way, in the first and second working examples too, it is not necessary to form low concentration regions 3a in an annular shape, and a configuration may be adopted such that the low concentration regions 3a are formed between high concentration regions 3b in the width direction of p-type diffusion layer 3.

In the sixth working example, it is possible to improve the breakdown voltage of high voltage isolation structure 20 as compared with that of a high voltage isolation structure wherein masks when forming p-type diffusion layer 3 are formed in the same width in linear portions 16 and corner portions 17, and the zones of p-type low concentration regions 3a and the zones of p-type high concentration regions 3b are formed in the same number.

Thus, a semiconductor device and manufacturing method thereof have been described according to the present invention. Many modifications and variations may be made to the techniques and structures described and illustrated herein without departing from the spirit and scope of the invention. Accordingly, it should be understood that the devices and methods described herein are illustrative only and are not limiting upon the scope of the invention.

| FIG. 3 | |
| --- | --- |
| A | Mask |
| B | Surface |
| C | Concentration locally low |
| D | Average value of diffusion depths |
| E | Resistance locally high |
| F | Resistance |
| G | Average value of resistances |
| H | Distance |
| FIG. 4 | |
| | |
| A | dV/dt SURGE |
| B | High voltage Nch MOSFET |
| FIG. 5 | |
| | |
| A | - - - - - Id Heretofore known structure |
| | ——— Id Present invention |
| B | Displacement current |
| C | Time |
| D | Drain voltage |
| FIG. 8 | |
| | |
| 3 | Double-RESURF region |
| 18 | High potential region |
| 19 | Low potential region |
| 20 | High voltage isolation region |
| FIG. 10C | |
| | |
| | Lateral diffusion |
| FIG. 13 | |
| | |
| A | Width direction of p-type diffusion layer |
| 3 | Double-RESURF region |
| 18 | High potential region |
| 19 | Low potential region |
| 20 | High voltage isolation region |

-continued

Figure 18:
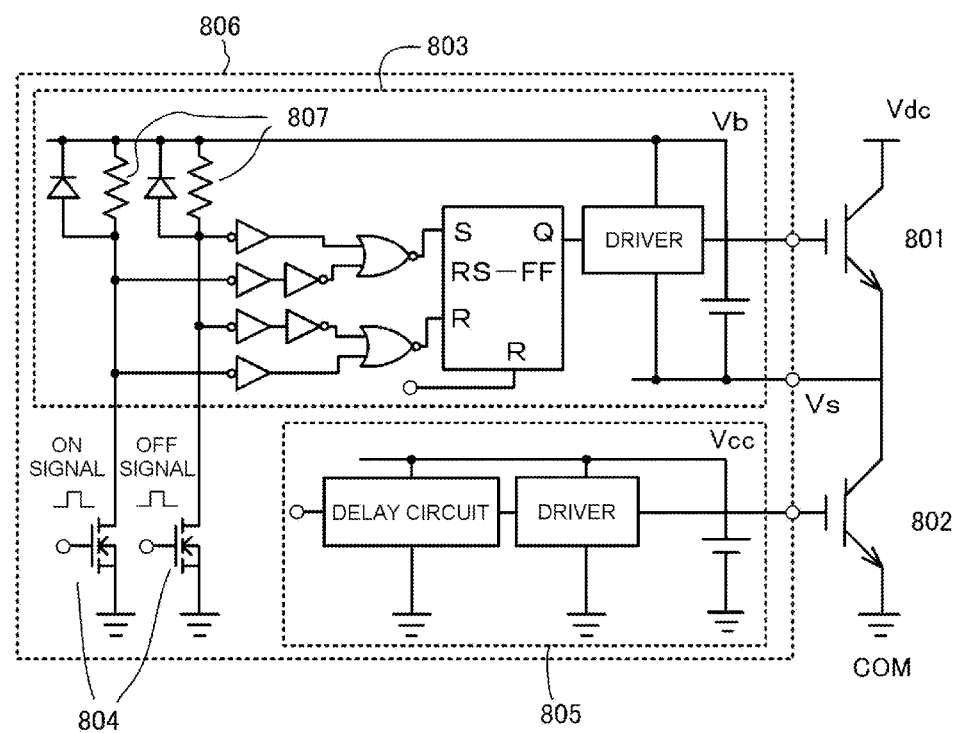
FIG. 18 is a circuit diagram for solving the problem of malfunction due to dV/dt noise shown in JP-A-2000-252809.
Figure 19:
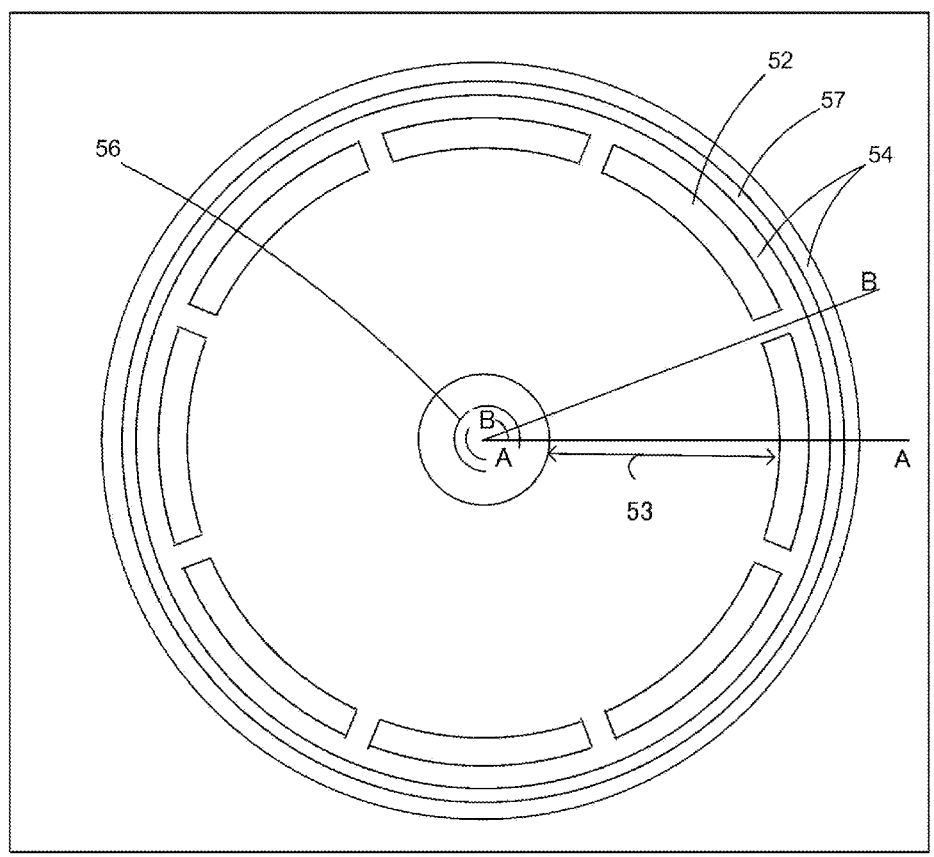
FIG. 19 is a main portion plan view of a heretofore known semiconductor device having a high voltage isolation structure that is a double-RESURF structure.
Figure 20:
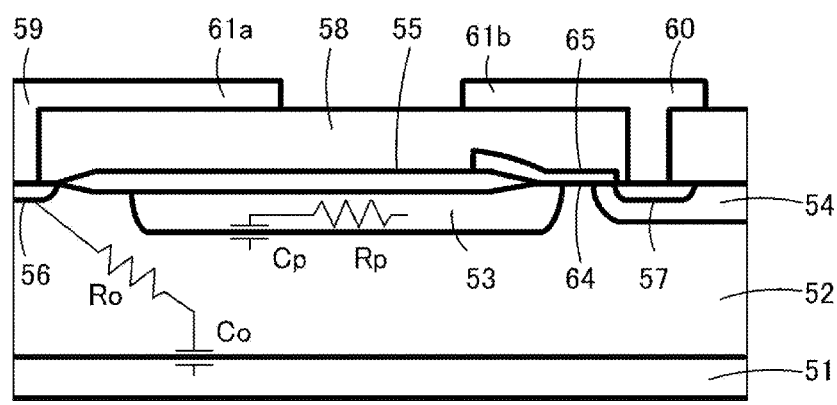
Figure 20:
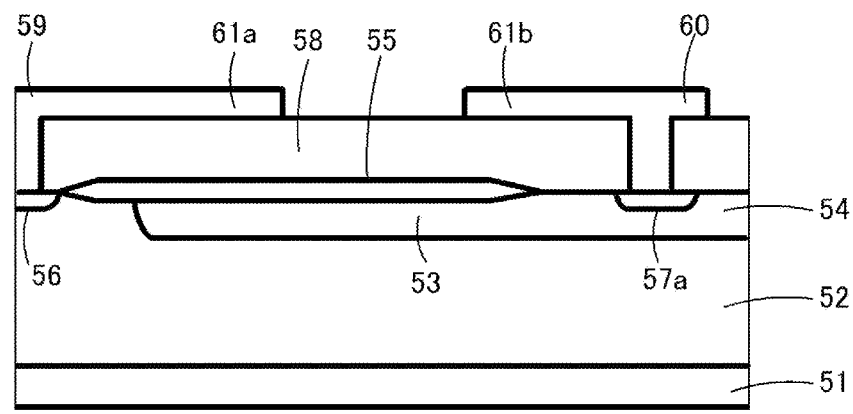

| FIG. 15 | | |
|---|---|---|
| A | Width direction of p-type diffusion layer | |
| 3 | Double-RESURF region | |
| 18 | High potential region | |
| 19 | Low potential region | |
| 20 | High voltage isolation region | |
| FIG. 16 | | |
| 803 | High side drive circuit | |
| 804 | Level shifter (High voltage MOSFET) | |
| 805 | Low side drive circuit | |
| 807 | Level shift resistance | |
| A | Driver | |
| B | Driver | |
| C | Delay circuit | |
| FIG. 18 | | |
| A | Driver | |
| B | ON signal | |
| C | OFF signal | |
| D | Delay circuit | |
| E | Driver | |

What is claimed is:

1. A semiconductor device comprising:
a second conductive type first semiconductor layer disposed on a first conductive type semiconductor substrate;
a second conducive type drain region selectively formed on a surface layer of the first semiconductor layer;
a first conductive type base region selectively formed on the surface layer of the first semiconductor layer so as to be away from the drain region;
a first conductive type first well region selectively formed on the surface layer of the first semiconductor layer between the drain region and base region so as to be away from the drain region and in partial contact with the base region;
a second conductive type source region selectively formed on a surface layer of the base region; and
a gate electrode disposed via a gate dielectric film on a surface of the base region between the source region and first semiconductor layer, wherein
the first well region includes first conductive type low concentration regions and first conductive type high concentration regions with a impurity concentration higher than that of the low concentration regions, and
the high concentration regions are separated by the low concentration regions.

2. The semiconductor device according to claim 1, wherein the low concentration regions and high concentration regions of the first well region are alternately disposed in a concentric shape.

3. The semiconductor device according to claim 1, wherein an embedded insulating film is disposed between the semiconductor substrate and first well region.

4. The semiconductor device according to claim 1, wherein the number of the low concentration regions is one or more, and the number of the high concentration regions is two or more.

5. The semiconductor device according to claim 1, wherein the low concentration regions are disposed so as to enclose the high concentration regions.

6. A method of manufacturing the semiconductor device according to claim 1, comprising:
forming a second conductive type first semiconductor layer on a first conductive type semiconductor substrate;
ion implanting first conductive type impurities using a shielding mask selectively formed on the first semiconductor layer; and
performing a heat treatment, thus forming a first conductive type base region and a first conductive type first well region, formed of high concentration regions and low concentration regions formed by lateral diffusion below the shielding mask, partially connected to the base region, wherein
a double-RESURF structure is configured by the semiconductor substrate, the first semiconductor layer and the first well region, and a dose amount for forming the first semiconductor layer by ion implantation and a dose amount for forming the first well region by ion implantation satisfy double-RESURF conditions.

7. A semiconductor device comprising:
a second conductive type first semiconductor layer disposed on a first conductive type semiconductor substrate;
a second conducive type drain region selectively formed on a surface layer of the first semiconductor layer;
a first conductive type base region selectively formed on the surface layer of the first semiconductor layer so as to be away from the drain region;
a first conductive type first well region selectively formed on the surface layer of the first semiconductor layer between the drain region and base region so as to be away from the drain region and in partial contact with the base region;
a second conductive type source region selectively formed on a surface layer of the base region; and
a gate electrode disposed via a gate dielectric film on a surface of the base region between the source region and first semiconductor layer, wherein
the first well region includes first conductive type low concentration regions and first conductive type high concentration regions with a impurity concentration higher than that of the low concentration regions, and
the low concentration regions are formed between the high concentration regions in a source-drain direction of the first well region.

8. The semiconductor device according to claim 7, wherein the low concentration regions and high concentration regions of the first well region are alternately disposed in a concentric shape.

9. The semiconductor device according to claim 7, wherein an embedded insulating film is disposed between the semiconductor substrate and first well region.

10. The semiconductor device according to claim 7, wherein the number of the low concentration regions is one or more, and the number of the high concentration regions is two or more.

11. The semiconductor device according to claim 7, wherein the low concentration regions are disposed so as to enclose the high concentration regions.

12. A semiconductor device comprising:
a second conductive type first semiconductor layer formed on a first conductive type semiconductor substrate;
a first conductive type base region of an annular plan-view shape formed by diffusion on a surface layer of the first semiconductor layer;
a first conductive type first well region formed on the inner side of the base region on the surface layer of the first semiconductor layer so as to be in partial contact with the base region;

a second conductive type drain region selectively formed on the inner side of the first well region on the surface layer of the first semiconductor layer;

a second conductive type source region selectively formed opposite the drain region on the surface layer of the base region; and a gate electrode disposed via a gate dielectric film on the base region between the source region and first semiconductor layer;

the semiconductor device having a high voltage isolation structure formed of a double-RESURF structure wherein the first semiconductor layer is sandwiched by the semiconductor substrate and first well region, wherein the plan-view shape of the upper surface of the high voltage isolation structure is formed of linear portions and corner portions having a fixed curvature, and the first well region in the corner portions includes high concentration regions with a deep diffusion depth and low concentration regions with a shallow diffusion depth, and wherein the high concentration regions and low concentration regions are alternately formed in an annular shape in a width direction of the first well region.

13. A semiconductor device comprising:

a second conductive type first semiconductor layer formed on a first conductive type semiconductor substrate;

a first conductive type base region of an annular plan-view shape formed by diffusion on a surface layer of the first semiconductor layer;

a first conductive type first well region formed on the inner side of the base region on the surface layer of the first semiconductor layer so as to be in partial contact with the base region;

a second conductive type drain region selectively formed on the inner side of the first well region on the surface layer of the first semiconductor layer;

a second conductive type source region selectively formed opposite the drain region on the surface layer of the base region; and a gate electrode disposed via a gate dielectric film on the base region between the source region and first semiconductor layer;

the semiconductor device having a high voltage isolation structure formed of a double-RESURF structure wherein the first semiconductor layer is sandwiched by the semiconductor substrate and first well region, wherein the plan-view shape of the upper surface of the high voltage isolation structure is formed of linear portions and corner portions having a fixed curvature, and the first well region in the corner portions includes high concentration regions with a deep diffusion depth and low concentration regions with a shallow diffusion depth, and wherein the low concentration regions are formed between the high concentration regions in a width direction of the first well region.

14. The semiconductor device according to claim 13, wherein the proportion in surface area of the low concentration regions to the high concentration regions is greater in the corner portions than in the linear portions.

* * * * *